United States Patent
Qin et al.

(10) Patent No.: US 8,324,088 B2
(45) Date of Patent: Dec. 4, 2012

(54) SPUTTERING-LESS ULTRA-LOW ENERGY ION IMPLANTATION

(75) Inventors: Shu Qin, Boise, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/098,607

(22) Filed: May 2, 2011

(65) Prior Publication Data

US 2011/0212608 A1 Sep. 1, 2011

Related U.S. Application Data

(63) Continuation of application No. 11/861,665, filed on Sep. 26, 2007, now Pat. No. 7,935,618.

(51) Int. Cl.
*H01L 21/425* (2006.01)
(52) U.S. Cl. .......... 438/514; 257/E21.336; 257/E21.337
(58) Field of Classification Search ... 257/E21.336–337, 257/E21.332; 438/514
See application file for complete search history.

(56) References Cited

U.S. PATENT DOCUMENTS

| | | | |
|---|---|---|---|
| 3,908,183 A | 9/1975 | Ennis | |
| 3,933,528 A | 1/1976 | Sloan, Jr. | |
| 4,587,432 A | 5/1986 | Aitken | |
| 4,776,925 A | 10/1988 | Fossum et al. | |
| 5,124,174 A | 6/1992 | Musket et al. | |
| 5,199,999 A * | 4/1993 | Clapham et al. | 148/239 |
| 5,429,955 A | 7/1995 | Joyner et al. | |
| 5,587,039 A | 12/1996 | Salimian et al. | |
| 5,672,541 A | 9/1997 | Booske et al. | |
| 5,933,359 A | 8/1999 | Sawahata | |
| 5,960,322 A | 9/1999 | Xiang et al. | |
| 5,977,552 A | 11/1999 | Foad | |
| 5,999,719 A | 12/1999 | Asada et al. | |
| 6,232,166 B1 | 5/2001 | Ju et al. | |
| 6,235,610 B1 | 5/2001 | Nicotra et al. | |
| 6,426,291 B1 | 7/2002 | Hu et al. | |
| 6,440,786 B1 | 8/2002 | Dowben | |
| 6,774,013 B2 | 8/2004 | Dowben et al. | |
| 6,797,596 B2 | 9/2004 | Ahmed et al. | |
| 6,808,747 B1 | 10/2004 | Shih et al. | |
| 7,077,902 B2 | 7/2006 | Vaartstra | |
| 7,115,509 B2 | 10/2006 | Chen et al. | |
| 7,144,809 B2 | 12/2006 | Elers et al. | |
| 7,179,703 B2 | 2/2007 | Gonzalez et al. | |
| 7,202,519 B2 | 4/2007 | Gonzalez | |
| 7,220,683 B2 | 5/2007 | Yin et al. | |
| 7,238,597 B2 | 7/2007 | Williams | |
| 2002/0004444 A1 | 1/2002 | Goela et al. | |
| 2003/0200917 A1 | 10/2003 | Vaartstra | |
| 2006/0001175 A1 | 1/2006 | Sandhu et al. | |
| 2006/0032525 A1 | 2/2006 | Olsen et al. | |

(Continued)

OTHER PUBLICATIONS

International Technology Roadmap for Semiconductors, 2005 Edition, Emerging Research Devices, http://www.itrs.net/Links/2005ITRS/Home2005.htm.

(Continued)

*Primary Examiner* — Matthew Landau
*Assistant Examiner* — Daniel Luke
(74) *Attorney, Agent, or Firm* — TraskBritt

(57) ABSTRACT

Methods of implanting dopants into a silicon substrate using a predeposited sacrificial material layer with a defined thickness that is removed by sputtering effect is provided.

23 Claims, 10 Drawing Sheets

U.S. PATENT DOCUMENTS

| | | | |
|---|---|---|---|
| 2006/0043316 | A1 | 3/2006 | Liebert et al. |
| 2006/0046345 | A1 | 3/2006 | Akram et al. |
| 2006/0063360 | A1 | 3/2006 | Singh et al. |
| 2006/0081926 | A1 | 4/2006 | Gonzalez et al. |
| 2006/0099830 | A1 | 5/2006 | Walther et al. |
| 2006/0121706 | A1 | 6/2006 | Bernstein et al. |
| 2006/0255296 | A1 | 11/2006 | Borden |
| 2007/0026544 | A1 | 2/2007 | Tsuno |
| 2007/0048453 | A1 | 3/2007 | Qin et al. |
| 2007/0087574 | A1 | 4/2007 | Gupta et al. |
| 2007/0161260 | A1 | 7/2007 | Vaartstra |

OTHER PUBLICATIONS

International Technology Roadmap for Semiconductors, 2005 Edition, Executive Summary, http://www.itrs.net/Links/2005ITRS/Home2005.htm.

James Ziegler—Srim & Trim, http://www.srim.org, printed Aug. 13, 2007.

Avant!... Solutions & Products, Taurus-Process, printed Feb. 22, 2001.

Heavy-Ion Nuclear Physics Research, G. Equipment Development, pp. 93-108, date unknown.

Y. Ban, et al., Modeling of Ultra-Low Energy Ion Implantation by Monte-Carlo Method, pp. 44-47. http://www.nsti.org/procs/MSM2000/2/M31.02; printed Apr. 15, 2009.

The MathWorks—Matlab—The Language of Technical Computing, http://www.mathworks.com/products/matlab/index.htmo?sec=apps, printed Aug. 13, 2007.

M.A. Capano, et al., Activation of Nitrogen, Phosphorus, Aluminum, and Boron Implants in SiC, SiC Ion Implantation Research and Purdue, http://www.ecn.purdue.edu/WBG/Basic.sub.--Measurements/Ion.sub.--Implanta- tion/Index.html; printed Aug. 7, 2007.

Parallax Research, Inc., Low-energy WDS: Depth Profiling PLAD Deposited Boron, http://www.parallaxray.com/hexs/Application-Notes/Boron.sub.--Depth- .sub.--Profiling.pdf; Feb. 23, 2007.

A. Fuad, et al., Preparation of Bi4Ti3O12 Thin Films by a Pulsed Laser Ablation Deposition (PLAD) Method and Their Applications for Ultraviole Detectors; http://arxiv.org/pdf/cond-mat/0107217, circa 2001.

A. Agarwal, et al., Ultra-Shallow Junction Formation Using Ion Implantation and Rapid Thermal Annealing: Physical and Practical Limits, 197th Meeting of the Electrochemical Society, Symposium II-Rapid Thermal and Other Short-Time Processing Technologies, Toronto, Canada, May 14-18, 2000, ECS PV 2000-9, pp. 49-60.

J.D. Bernstein et al., 2000 International Conference on Ion Implantation Technology Proceedings, Alpbach, Austria, Sep. 17-22, 2000, pp. 464-467.

Shu Qin, et al., Review of Scientific Instruments, vol. 73, No. 2, pp. 840-842, Feb. 2002.

* cited by examiner

SPUTTERING-LESS ULTRA-LOW ENERGY ION IMPLANTATION

CROSS-REFERENCE TO RELATED APPLICATION

This application is a continuation of U.S. Ser. No. 11/861,665, filed Sep. 26, 2007, now U.S. Pat. No. 7,935,618, the entire content of which is incorporated by reference herein.

TECHNICAL FIELD

Embodiments of the invention relate to methods for doping substrates in semiconductor constructions.

BACKGROUND OF THE INVENTION

A continuing trend in the semiconductor industry is increased densification and miniaturization of features. In fabricating semiconductor devices, including resistors, capacitors and transistors, device size must continue to shrink in order to increase the performance and lower the cost of ultra-large scale integrated (ULSI) circuits. Among the components that continue to reduce in scale are junctions, which are doped regions on a wafer where dopants such as boron, phosphorus and arsenic, are implanted into a silicon substrate. The dopants impart desired electrical properties to the wafer by allowing silicon, normally only a semiconducting material, to conduct current. Junctions are used to form source and drain (S/D) regions of MOS transistors. Devices now require shallow junctions, which are formed by implanting ions to shallow depths on the order of about 100-500 angstroms and typically about 300 angstroms or less. The formation of ultra-shallow junctions allows smaller device dimensions and higher circuit density.

Ion implantation is replacing diffusion as the standard technique for introducing conductivity-altering dopant materials into semiconductor wafers in most ULSI doping processes. FIG. 1 schematically illustrates a conventional ion beam implanter 10 for forming doped regions in a wafer 12. In a conventional beam-line type ion implantation system, a desired dopant material is ionized in an ion source 14 to form an ion beam 16, the ions are accelerated to a high velocity using an accelerator 18, and the ion beam 16 is directed at the wafer 12 situated on a wafer chuck 20. The depth to which ions are implanted in the wafer is obtained by controlling the energy of the ions as they impinge on the wafer surface. The beam current in implanters generally ranges between about 1 mA to 30 mA, depending on the implant species, energy and type of implanter. The ions penetrate the surface of the wafer and are embedded into the crystalline lattice of the semiconductor material. The number of implanted ions per unit area, or dose ($\phi$), is related to beam current I (amperes), beam area A (cm$^2$) and implant duration t (seconds), and typically ranges from $10^{11}$-$10^{16}$ ions/cm$^2$. The implanted substrate is subsequently annealed (e.g., at about 900-1,100° C.) in an inert gas (e.g., N$_2$, etc.) to activate the dopants, i.e., transfer the dopants from impurities to carriers in the crystal lattice.

The reduction of device dimensions, for example, the shortened channel lengths of MOS transistors, creates a so-called short-channel effect (SCE). To minimize the short-channel effect, an ultra-shallow junction depth ($x_j$) and low enough sheet resistance ($R_s$) are required for the source/drain (S/D) fabrication of MOS transistors. For example, for a 45 nm technology node based on the International Technology Roadmap on Semiconductor 2005 (ITRS2005), it is required that the junction depth of S/D extension is shallower than 6.5 nm and the activated Rs of S/D extension is lower than 650 Ω/sq. To meet these requirements as device size shrinks, ultra-low energy (e.g., <1 keV for boron) ion implantation must be used.

Conventional beam-line ion implantation offers advantages over traditional diffusion techniques, including (1) precise control of dose and depth profile due to decoupling of the doping and annealing processes; (2) low temperature processing, which allows the use of photoresist as a mask; (3) the ability to use a wide selection of masking material (e.g., metal, polysilicon, photoresist, oxide, etc.); and (4) less sensitivity to surface cleaning procedures. However, despite the advantages of conventional beam-line ion implantation processes, there are several drawbacks relating to fundamental physical limitations such as space charge limits, intrinsic sputtering effects, and implant angle limits for non-planar structures for low energy implants. These limitations create problems in microelectronics manufacturing.

With conventional beam-line ion implantation processes, the ion beam and momentum of the ions impinging on the wafer causes sputtering of the silicon substrate during doping, resulting in the removal of doped silicon material. The sputtering effect by energetic ion bombardment during ion implantation both affects the structure of the devices and the as-implanted dopant profile. Etching, including sputtering and reactive ion etching (RIE), is known to cause retained dose saturation of the dopant and, in turn, sheet resistance ($R_s$) saturation in the wafer. The implant dose in the substrate is removed by etching so that the dose is saturated after the removed depth equals the implant range (Rp).

In FIG. 2, the retained boron dopant dose (atoms/cm$^2$) and sheet resistance ($R_s$) (Ω/sq.) saturations is plotted as a function of nominal B implant dose (ions/cm$^2$) by ultra-low energy (500 ev) boron (B) beam-line ion implants. As shown, the value of $R_s$ does not fall below 650 Ω/sq. regardless of the duration (time period) of the ion implantation process (Shu Qin et al., "Measurement and analysis of deposition-etch characterization of BF$_3$ plasma immersion ion implantation," *Review of Scientific Instruments* 73(2): 840-842 (2002)). This demonstrates that for ultra-low energy implants, conventional beam-line ion implantation does not achieve the desired sheet resistance ($R_s$) due to its intrinsic sputtering effect.

It would be useful to provide a method for optimizing bean-line ion implants that overcomes these or other problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the terms "semiconductor substrate" or "semiconductive substrate" or "semiconductive wafer fragment" or "wafer fragment" or "wafer" will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

Conventional processes using beam-line ion implantation for doping a silicon substrate cause sputtering of the silicon substrate, which can result in a loss of the implanted dopant material from the substrate layer. Embodiments of the invention optimize ultra-low energy beam-line ion implantation to reduce sputtering of a silicon substrate to be doped by use of a sacrificial material film layer that is pre-deposited onto a silicon substrate surface. Due to the low sputtering yield and optimized thickness of the sacrificial material film, sputtering of the silicon substrate is eliminated and the retained dopant dose and $R_s$ saturations are improved. The resulting doped silicon substrate has reduced sheet resistance and improved electrical properties.

Figure 1:
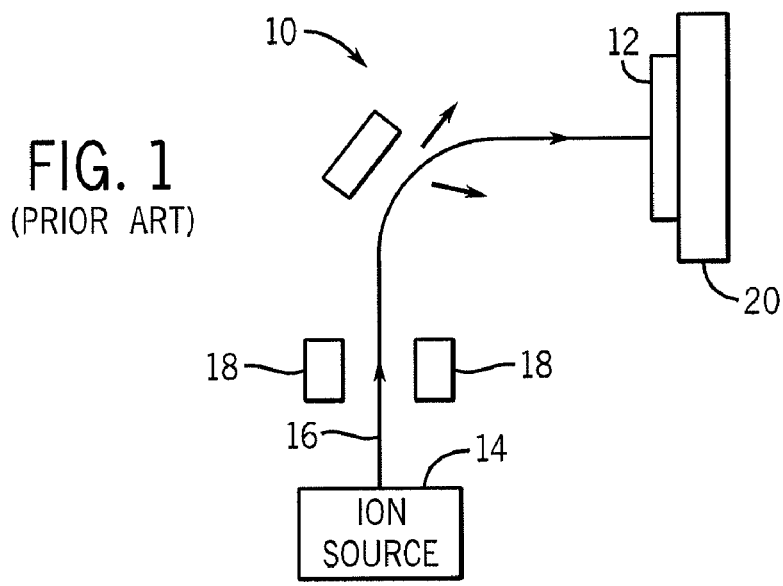
FIG. 1 schematically illustrates a conventional ion beam implanter.
Figure 2:
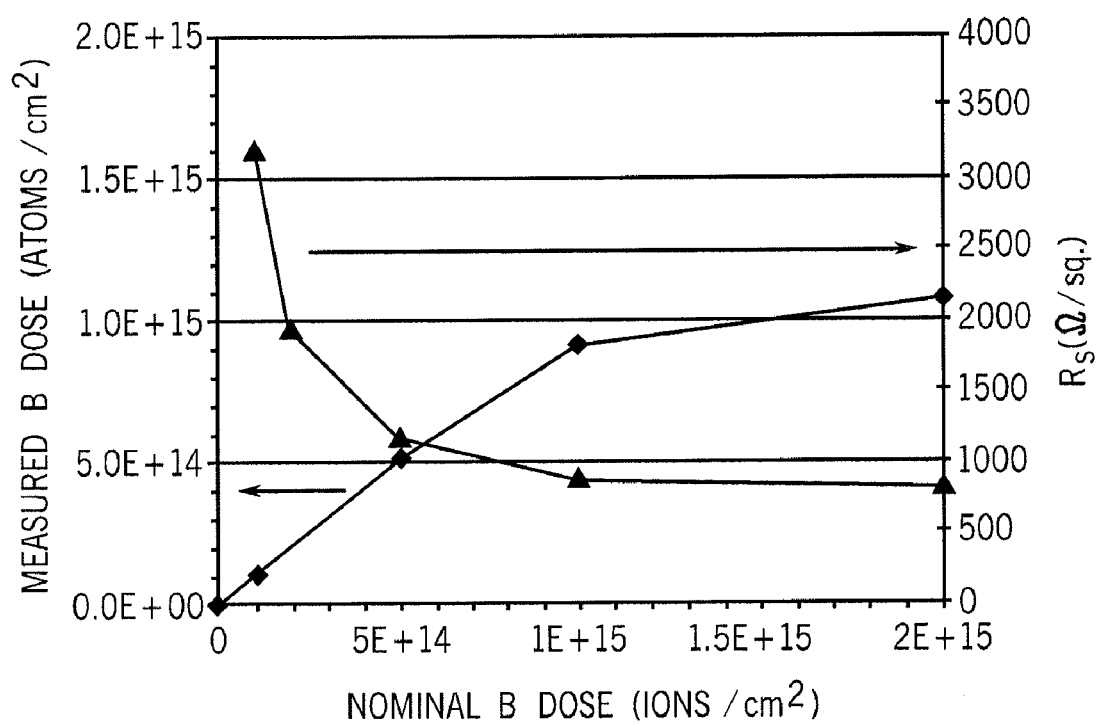
FIG. 2 graphically illustrates retained boron (B) dose (atoms/cm$^2$) and sheet resistance ($R_s$) (Ω/sq.) saturations plotted as a function of nominal B implant dose (ions/cm$^2$) ($^{11}$B$^+$ 500 eV, beam-line ion implant, RTP: 1050° C./0s)(♦=B dose, ▲=$R_s$).
Figure 3:
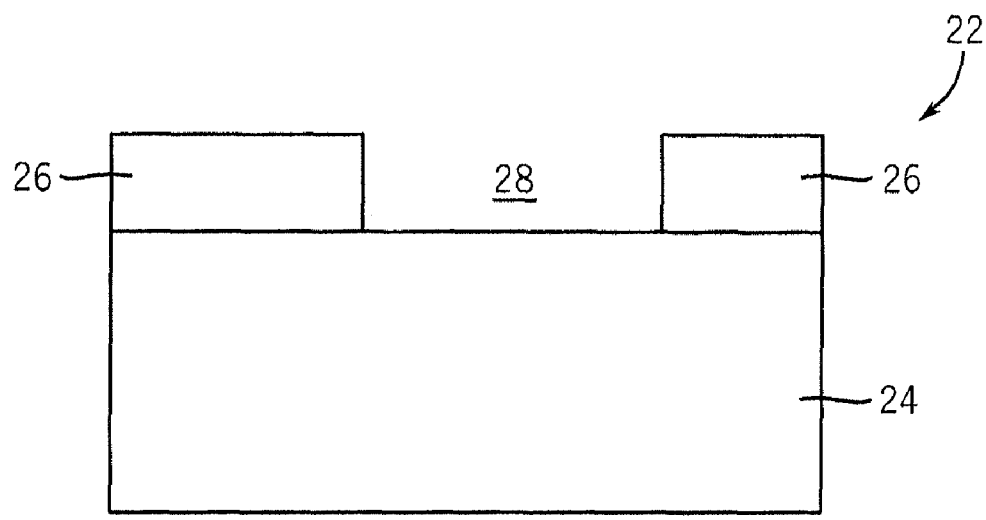
FIG. 3 illustrates a diagrammatic, cross-sectional view of a portion of a substrate at a preliminary processing stage according to an embodiment of the present disclosure.

An embodiment of a method according to the invention for doping a silicon substrate using an ultra-low energy beam-line ion implantation process is illustrated with reference to FIGS. 3-6. FIG. 3 illustrates a substrate fragment indicated generally with reference to numeral 22 at a preliminary processing stage. The substrate fragment 22 in progress can comprise a semiconductor wafer substrate or the wafer along with various process layers formed thereon, including one or more semiconductor layers or other formations, and active or operable portions of semiconductor devices.

The substrate fragment 22 comprises a substrate 24 to be doped to a conductivity type and a masking layer 26. The substrate 24 is generally a semiconductor material such as monocrystalline, polycrystalline or amorphous silicon. A typical thickness of the silicon substrate 24 is about 300-800 μm. The masking layer 26, typically photoresist, is formed over the silicon substrate 24, and as depicted, can be exposed and developed using conventional photolithographic techniques. Other mask materials such as silicon dioxide, silicon nitride, carbon, among others, can also be used. The masking layer 26 provides a desired pattern with openings 28 that define and expose selected areas of the silicon substrate 24 to be doped to form, for example, source/drain (S/D) regions, polysilicon gate, etc.

Figure 4:
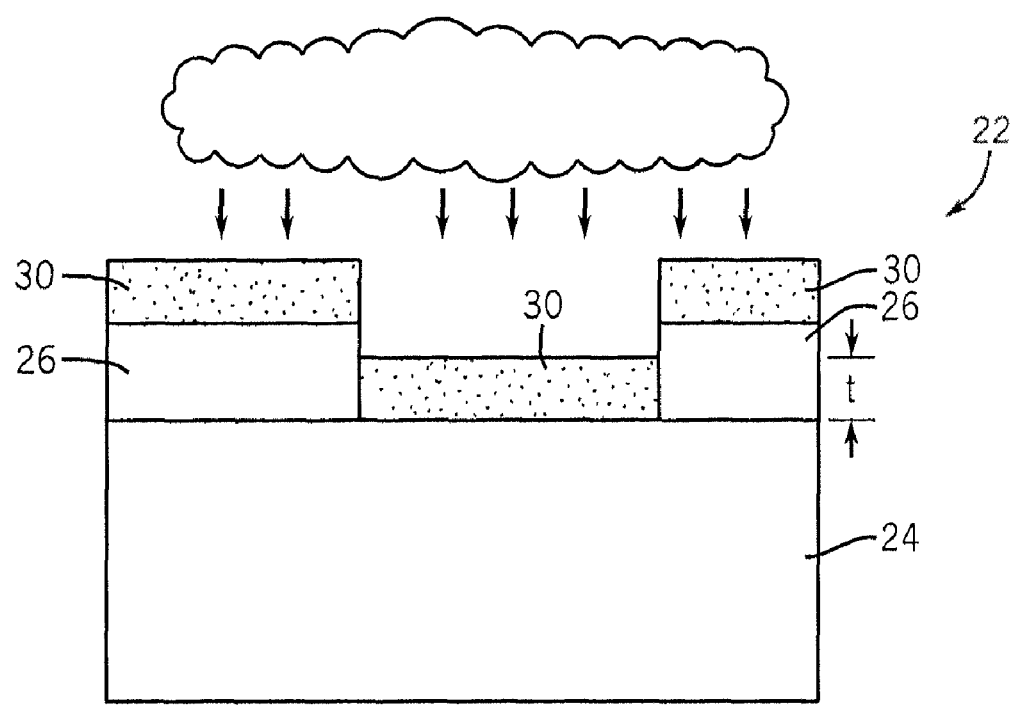
FIGS. 4-6 are cross-sectional views of the substrate depicted in FIG. 3 at subsequent processing stages according to an embodiment of the invention.

In accordance with the invention, as shown in FIG. 4, a sacrificial material layer 30 is predeposited (arrows ↓↓↓) onto the silicon substrate 24 (and masking layer 26) prior to ion implantation. The material layer 30 is considered to be a sacrificial material layer such that it is consumed during a subsequent ion implantation step. The thickness (t) of the predeposited sacrificial material layer 30 is designed and optimized such that the layer 30 is progressively consumed by sputtering effect during the ion implantation and completely (or substantially completely) removed from the substrate 24 by the end of the implantation process. The presence of the sacrificial material layer 30 substantially eliminates sputtering of the substrate 24 during the ion implantation process to reduce the loss of implanted dopant (through sputtering) and provide an increased retained dopant dose in the silicon bulk.

The material selected for the sacrificial material layer 30 possesses a lower sputtering rate or yield than the silicon substrate 24 and is compatible with the ions to be implanted and the implantation process that is used for implanting the ion species. The sacrificial material is selected so that byproducts resulting from sputtering of layer 30 during the ion implantation processing do not contaminate the substrate or form impurities that would be incorporated into the silicon substrate 24 and adversely affect the nature and/or functioning of the doped substrate. Other factors considered in the selection of the material for the sacrificial material layer include low particle generation, ease of formation and processing, reasonable cost and process integration compatibility.

The sacrificial material layer 30 is composed of the same species or dopant type (e.g., n- or p-type) as the dopant being implanted, or other material that is compatible with the dopant and silicon substrate 24, to eliminate contamination and not adversely affect the character of the doped substrate 24. For example, in embodiments in which p-type dopants (e.g., boron, etc.) are ion implanted in a silicon substrate 24, the sacrificial material layer 30 can be formed from a carbon material (e.g., amorphous carbon, silicon carbide (SiC), etc.), or from a boron (B) material (e.g., boron (B), boron carbide ($B_4C$), silicon boride ($SiB_6$), etc.) where boron (B) is implanted. In embodiments in which n-type dopants (e.g., phosphorus, arsenic, etc.) are ion implanted, the sacrificial material layer 30 can be formed from a carbon material, or from a phosphorus (P) or arsenic (As) material where P or As, respectively, are implanted. A boron or carbon film used as a sacrificial layer produces only about one-third of the sputtering yield of a silicon substrate. In addition, carbon is an electrically neutral material if incorporated into silicon, and thus does not adversely affect the doped silicon substrate. The sacrificial material layer can be analyzed by known techniques, for example, by transmission electron microscopy (TEM), x-ray photoelectron spectroscopy (XPS), and x-ray diffraction (XRD).

The sacrificial material layer 30 can be formed on the silicon substrate 24 by various processes known in the art. For example, the sacrificial material layer can be vapor deposited in a processing chamber by atomic layer deposition (ALD), plasma doping deposition (PLAD), chemical vapor deposition (CVD), plasma enhanced CVD (PECVD), or other vapor deposition process. The use of ALD or PLAD deposition methods to form the sacrificial material layer provides acceptable controllability and repeatability in the nanometer regime of deposition processing.

Generally, in an ALD process, one or more precursor gas source gases are pulsed into a deposition chamber for a selected time period (pulse duration), the gases are vaporized and chemisorb as a monolayer onto the substrate, and a number of consecutive deposition cycles are conducted to deposit thin layers (e.g., about 0.2-3.0 Å per cycle) until a layer of the desired thickness is built up on the substrate. In a PLAD process, which is conducted under deposition conditions, reaction gases can be fed into a reactor where an energy source generates a plasma and the gas species react and deposit as a layer onto the surface of the substrate. In a CVD or PECVD process, a source gas or combination of gases is fed into a reaction chamber where the gases react and thermally decompose on a heated substrate.

In embodiments of the invention, a sacrificial material layer 30 of boron, phosphorus or arsenic can be formed by a vapor deposition process using a hydride gas such as diborane ($B_2H_6$), tetraborane ($B_4H_{10}$), phosphine ($PH_3$), arsine ($AsH_3$), or others, in an inert carrier gas (e.g., argon, helium, nitrogen). The layer 30 can be deposited in a single step or in multiple steps to achieve a desired thickness.

In another embodiment, boron carbide ($B_xC$) can be deposited as the sacrificial material layer 30 in a vapor deposition process (e.g., ALD, CVD, PECVD) using a boron gas precursor such as diborane ($B_2H_6$), tetraborane ($B_4H_{10}$) or boron trichloride ($BCl_3$), and a carbon-forming precursor (e.g., $CH_4$, $C_3H_8$, $C_3H_6$, etc.), as described, for example, in U.S. Patent Application Publication 2006/0001175 (Sandhu et al., Micron Technology Inc.). For example, a boron carbide ($B_xC$) layer can be vapor deposited from a gas mixture of $B_2H_6/CH_4$ or $BCl_3/CH_4/H_2$ or $B_2H_6/B_4H_{10}$/borane carbonyl ($BH_3CO$).

In other embodiments, a silicon carbide (SiC) layer can be formed as the sacrificial material layer 30 by vapor deposition using a silicon gas precursor such as silane ($SiH_4$), in combination with a carbon-forming precursor, e.g., a $SiH_4$/hydrocarbon gas mixture, as described, for example, in U.S. Patent Application Publication 2002/000444 (Goela et al.; CVD SiC) and U.S. Patent Application Publication 2006/0046345 (Akram et al., Micron Technology, Inc.).

Vapor deposition processing (e.g., CVD, PECVD) can also be used to form a sacrificial material layer 30 of an amorphous carbon (or transparent amorphous carbon) using one or more hydrocarbon process gas such as propylene ($C_3H_6$), methane ($CH_4$), acetylene ($C_2H_2$), ethylene ($C_2H_4$), ethane ($C_2H_6$), propane ($C_3H_8$), etc., as described, for example, in U.S. Pat. No. 7,220,683 (Yin, et al.) and U.S. Patent Application Publication 2006/0001175 (Sandhu et al., Micron Technology, Inc.).

A boron sacrificial material layer can also be formed by physical vapor deposition (PVD) by sputtering (sputter vapor deposition) using solid (pure) boron or a solid boron compound such as boron carbide ($B_4C$) as the sputter target, as described for example, in U.S. Pat. No. 5,672,541 (Booske et al.) and U.S. Patent Application Publication 2006/0032525 (Olsen et al). Briefly, in a sputter vapor deposition, a silicon substrate (wafer) is inserted into a vacuum chamber, ions are generated and directed at a sputter target material, and the sputtered atoms are deposited as a layer on the substrate.

In another embodiment, the sacrificial layer can be formed by thermal spraying (e.g., plasma spraying) a material layer onto the substrate. Boron carbide, for example, can be deposited using thermal spray techniques, as a plasma spray generated from a powdered material (e.g., a high-purity $B_4C$) that is heated in a high-temperature gas stream (e.g., plasma gas) to above its melting point, as described, for example, in U.S. Pat. No. 6,808,747 (Shih et al.). The heated, high velocity gas and entrained molten powder strike the substrate to be coated and the molten powder solidifies on contact with the substrate to form a coating of the powdered material.

Figure 5:
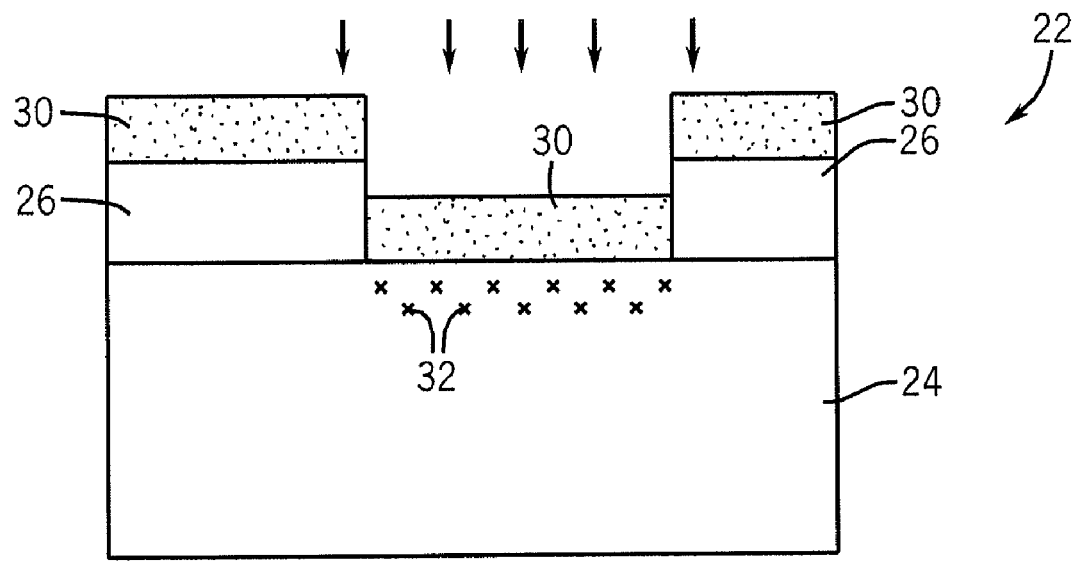

Referring now to FIG. 5, using conventional beam-line ion implantation (arrows ↓↓↓), the unmasked sections of the silicon substrate 24 are then doped to a p-type or n-type conductivity and a selected dose using a dopant species 32 that is compatible with or of the same type species as used for the sacrificial material layer 30.

The energy used is determined by the desired depth of the implant. In some embodiments, the ion implantation is conducted at an ultra-low energy range, e.g., to form a shallow junction 34, typically about 500 eV to about 1 keV using an ultra-low energy ion implanter (sub-2 keV). The amount of dopant ions 32 that is implanted is effective to provide a low sheet resistance ($R_s$). For example, an implant dosage of about 1e14-1e16 ions/$cm^2$ at a beam energy of about 0.2-2 keV is typically used. For a shallow junction source/drain (SD) application, a dose of at least about 1e15 ions/$cm^2$ or higher is typical.

The profile of the implant can be predicted using a variety of computer simulation tools that conduct ion implantation process simulations for a semiconductor device to determine an ion implantation profile. For example, computer simulation techniques using known software such as SRIM and TRIM packages can be used for modeling the ion implantation process to achieve the appropriate implant conditions and dose amounts. For example, the depth and profile of an ion implant species can be estimated by using SRIM2006 (Stopping Range of Ions in Matter), a widely available simulation program that calculates the depth and distribution of ions implanted into materials and takes into account the density of the material being implanted and the energy and mass of the impacting species. A SRIM simulation program can also be utilized to simulate and calculate the sputtering rates for different ion species with different energies on different substrates.

Sputtering of the sacrificial material layer 30 occurs as the ion implantation proceeds, resulting in a continuous decrease in the thickness (t) of the sacrificial material layer 30. The sacrificial material layer 30 is predeposited on the silicon substrate 24 to a pre-designed thickness to maintain a film over the silicon substrate 24 until the completion of the ion implantation. The thickness (t) of the predeposited sacrificial material layer 30 is optimized and controlled based on the implantation of a defined dose so that the layer is completely expended (used up) at the end or completion of an implantation step to implant the defined dose, and essentially none of the sacrificial material layer 30 remains, as illustrated in FIG. 6.

Figure 6:
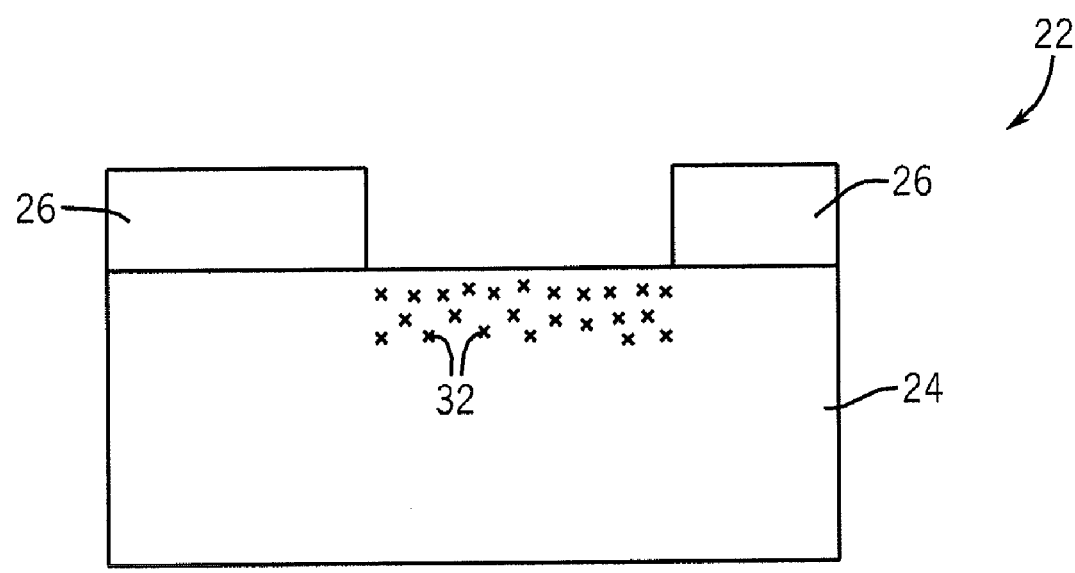

As illustrated in FIGS. 3-6, in some embodiments, the sacrificial material layer 30 is predeposited onto the silicon substrate 24 to a calculated thickness (t) in a single application, and the defined dosage is then ion implanted in one step (FIG. 5), with sputtering completely removing the layer 30 from the substrate 24 at the end of the implantation process (FIG. 6). The optimal required thickness of the sacrificial material layer 30 for complete removal by self-sputtering by the end of the implantation process can be calculated and determined based on factors such as the sputtering yield data or sputtering rate of the sacrificial material, the ion implantation species 32, the nominal dose amount that is applied, and process conditions such as the implant energy.

In embodiments of the invention in which the sacrificial layer 30 is deposited and the entire defined dosage is then ion implanted, the thickness of the predeposited sacrificial material layer 30 is typically about 40-60 angstroms. For example, in the use of a boron (B) sacrificial material layer 30 for implanting boron (B) ions 32 at a low implant energy of 500 eV, based on a sputtering rate of the sacrificial boron layer 30 of about 1 Å per 4e13 ions/cm$^2$ nominal dose and a required nominal boron dose of 2e15 ions/cm$^2$, the deposit of an about 50 Å sacrificial boron layer 30 will maintain a sacrificial boron film over the silicon substrate 24 for the duration of a beam-line ion implantation to implant the identified dose without sputtering of the silicon substrate 24, with the layer 30 being completely removed from the substrate 24 at the end of the implant.

Figure 7:
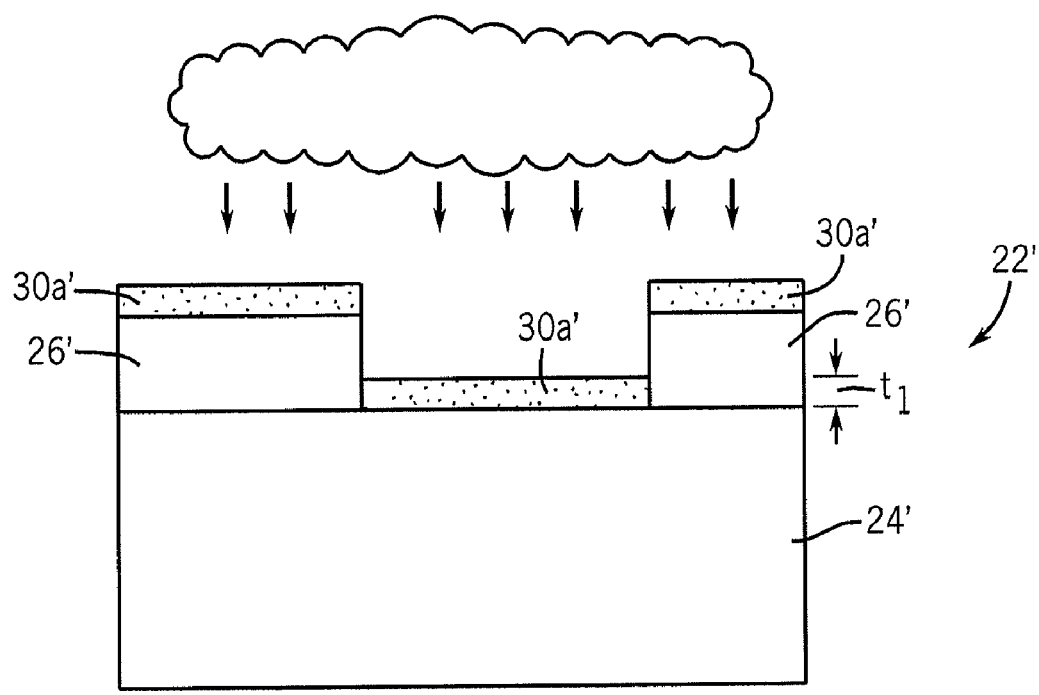
FIGS. 7-10 are cross-sectional views of the substrate depicted in FIG. 3 at subsequent processing stages according to another embodiment of the invention.
Figure 8:
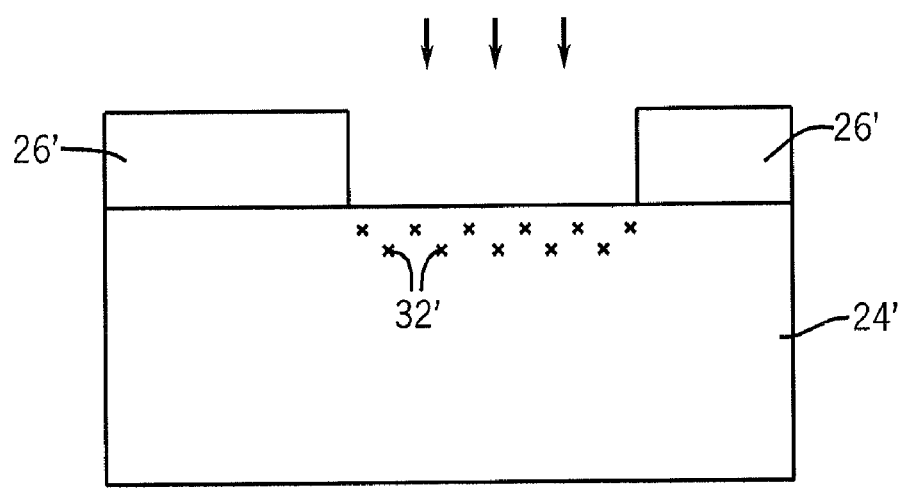
Figure 9:
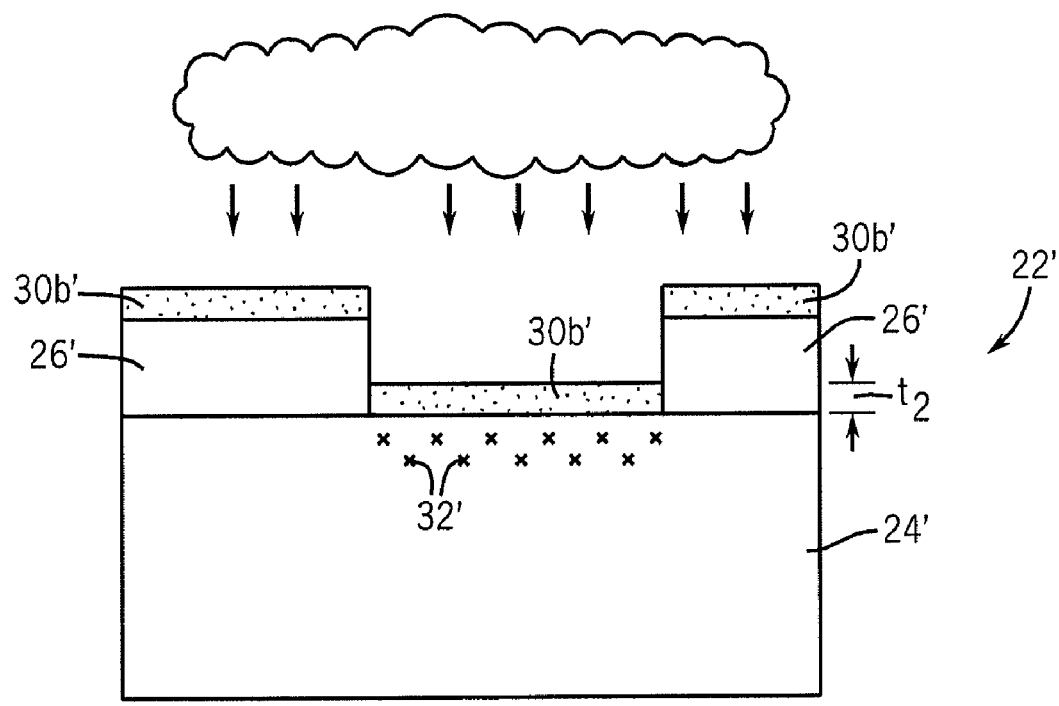
Figure 10:
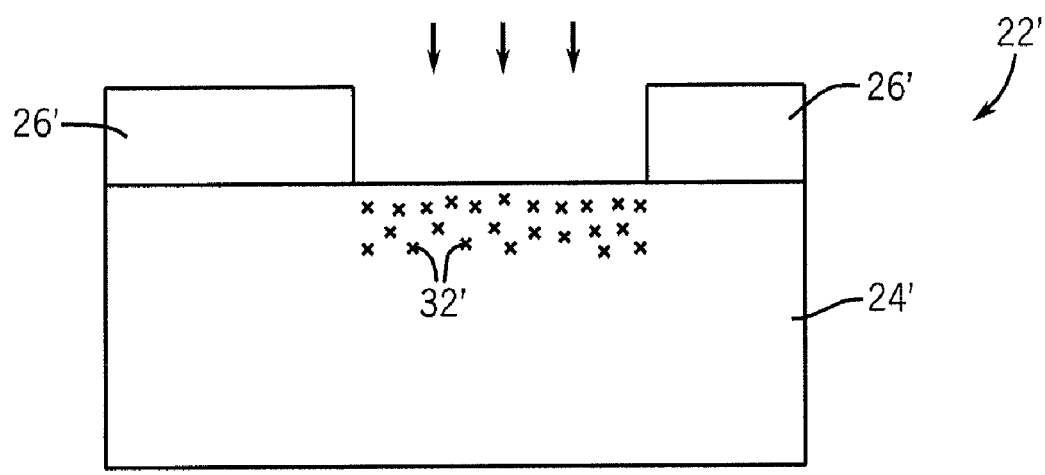

In another embodiment of the invention, illustrated in FIGS. 7-10, the ion implantation can be conducted in two or more stages to implant portions of the total defined dose amount, with the sacrificial material layer 30 being predeposited before each implanting step. Again, the thickness (t) of the sacrificial material layer 30 is calculated according to the dose that is implanted and the sputtering yield of the sacrificial material. For example, for implanting an about 1e15 atoms/cm$^2$ dose of boron ions 32' (of a total boron dose of 2e15 ions/cm$^2$) in a first step, a first sacrificial layer 30a' with a thickness ($t_1$) of about 25 Å can be deposited as depicted in FIG. 7, which thickness will maintain the sacrificial layer 30a' on the silicon substrate 24' to the completion of the first implanting step (FIG. 8). Then, prior to implanting the remaining 1e15 ions/cm$^2$ boron dose, a second sacrificial layer 30b' with a thickness ($t_2$) of about 25 Å can be pre-formed on the partially doped silicon substrate 24' as depicted in FIG. 9, which will maintain a film on the silicon substrate 24' to the completion of the second implanting step (FIG. 10), whereupon the sputtering effect from the ion implantation process will have completely removed the layer 30b' from the substrate 24'.

In embodiments of the invention in which multiple sacrificial layers 30a', 30b' are deposited and a portion of the defined dosage is then ion implanted after each such deposition, the thicknesses ($t_1$, $t_2$) of each of a first and second pre-deposited sacrificial layer 30a', 30b', for example, are typically about 20-30 angstroms. For example, in the use of a boron (B) sacrificial material layer 30 for implanting boron (B) ions 32', based on an implant energy of 500 eV, a sputtering rate of the sacrificial material layer 30 of about 1 Å per 4e13 ions/cm$^2$ nominal dose, and a 1e15 ions/cm$^2$ nominal dose for each implant step, the deposit of an about 25 Å sacrificial boron layer 30 for each implant step will maintain a sacrificial boron film over the silicon substrate for the duration of a beam-line ion implantation to implant the identified 1e15 ions/cm$^2$ nominal dose without sputtering of the silicon substrate 24', with each of the sacrificial layers 30a', 30b' being completely removed from the substrate 24' at the end of each of the implant steps.

Figure 11:
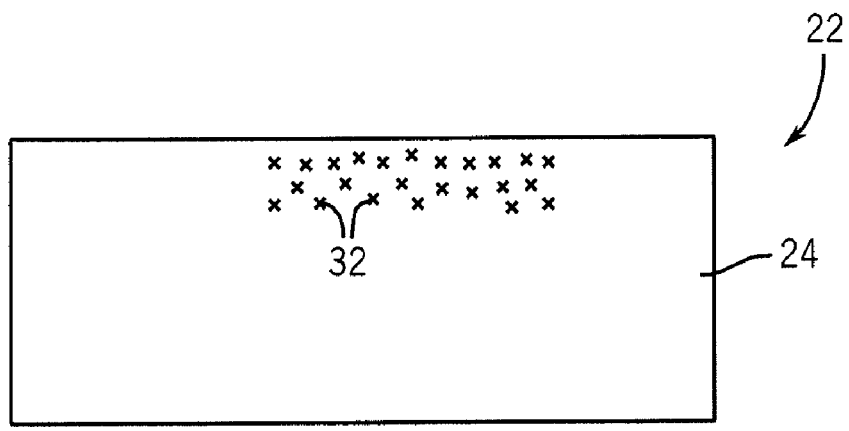
FIGS. 11 and 12 are cross-sectional views of the substrate depicted in FIG. 6 (or FIG. 10) at subsequent processing stages.

Referring now to FIG. 11, after the ion implantation process is completed, the photoresist masking layer 26 and/or other masking material can be selectively removed (stripped) with wet chemical, dry etching or a combination of both. Photoresist, for example, can be removed by a standard dry etch process using an oxygen ($O_2$) plasma ashing step. Optionally, the silicon substrate 24 can be treated by dry or wet etching to expose and clean the surface and remove any remaining residue of the sacrificial material layer 30 and/or masking layer 26.

Figure 12:
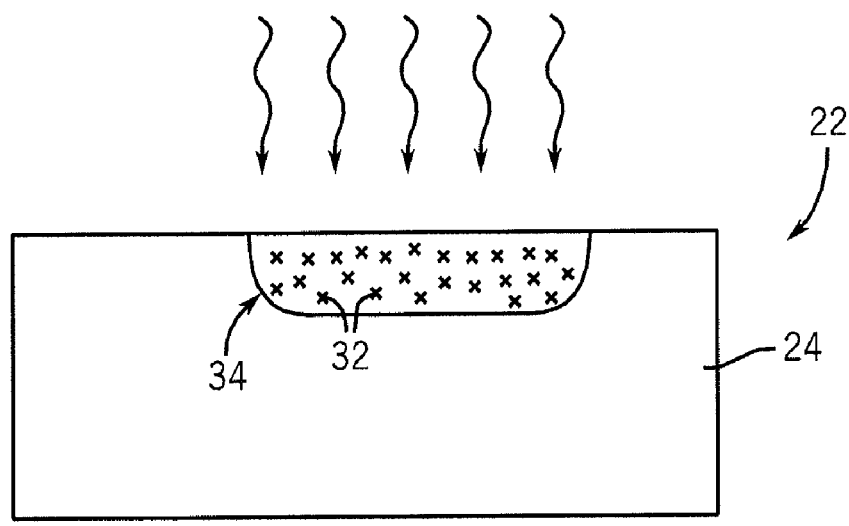

As depicted in FIG. 12, the doped substrate 24 can then be annealed (arrows ↓↓↓) to activate the implanted dopant ions 32, for example, using a rapid thermal anneal process at a temperature of about 900-1100° C., to form a shallow junction 34, for example. The ion dose (implanted and annealed) can be measured by a SIMS technique, and the sheet resistance ($R_s$) can be measured by a four point probe technique, using conventional techniques.

The described process results in a reduction of the implanted dopant loss caused by sputtering of a silicon substrate during beam-line ion implantation, an increase in the retained dopant dose in the silicon bulk, improvements in the $R_s$ saturation, and no or minimal structural change of the original substrate surface.

Embodiments of the invention can be used to produce shallow junctions, polysilicon gates, etc., with required junction depth ($X_j$) and sheet resistance ($R_s$). The doped substrate 24 can undergo additional processing steps known in the art to fabricate desired components. Finished semiconductor wafers can be cut into dies, which may then be further processed into integrated circuit chips and incorporated in electronic devices.

EXAMPLES

To illustrate the process of the invention, sputtering of various materials situated on a silicon substrate and the ion implantation of boron (B) and arsenic (As) ions in a silicon substrate using pre-deposited sacrificial material layers were investigated.

Compared to n-type impurities such as As or P, boron (B) ion species are more critical for ultra-low energy implant applications due to the lower mass (severe space charge effect), much lower solid solubility than n-type impurities, segregation behavior, and the intrinsically lower mobility of holes (thermally activated from boron impurity) than electrons.

Table I lists the sputtering yields (at atoms/ion) of boron ions ($B^+$) and arsenic ions ($As^+$) on different substrates which are III- or IV-family impurity materials, versus the $B^+$ and $As^+$ ion energy ranging from 200 ev to 2 keV.

TABLE I

Sputtering Yield by SRIM2006 Simulations

| Substrate | 200 eV Sputtering Yield (atoms/ion) | 500 eV Sputtering Yield (atoms/ion) | 700 eV Sputtering Yield (atoms/ion) | 1 keV Sputtering Yield (atoms/ion) | 1.5 keV Sputtering Yield (atoms/ion) | 2 keV Sputtering Yield (atoms/ion) |
|---|---|---|---|---|---|---|
| $B^+$ on Si | 0.5474 | 0.7717 | 0.8318 | 0.8987 | 0.9512 | 0.9368 |
| $B^+$ on B | 0.1682 | 0.2647 | 0.3038 | 0.3281 | 0.3785 | 0.3798 |
| $B^+$ on C | 0.1705 | 0.2633 | 0.2803 | 0.307 | 0.3304 | 0.3493 |
| $B^+$ on Al | 0.6976 | 0.9586 | 1.06 | 1.13 | 1.2 | 1.19 |
| $B^+$ on Ga | 0.51 | 0.8579 | 0.9962 | 1.14 | 1.22 | 1.3 |
| $B^+$ on In | 0.3869 | 0.7668 | 0.8981 | 1.03 | 1.2 | 1.22 |
| $B^+$ on Ti | 0.235 | 0.7264 | 0.8819 | 1.08 | 1.24 | 1.34 |
| $As^+$ on Si | 0.1152 | 0.3529 | 0.4821 | 0.6493 | 0.8826 | 1.07 |
| $A_s^+$ on C | 0.0122 | 0.0896 | 0.135 | 0.208 | 0.3202 | 0.4246 |

Figure 13:
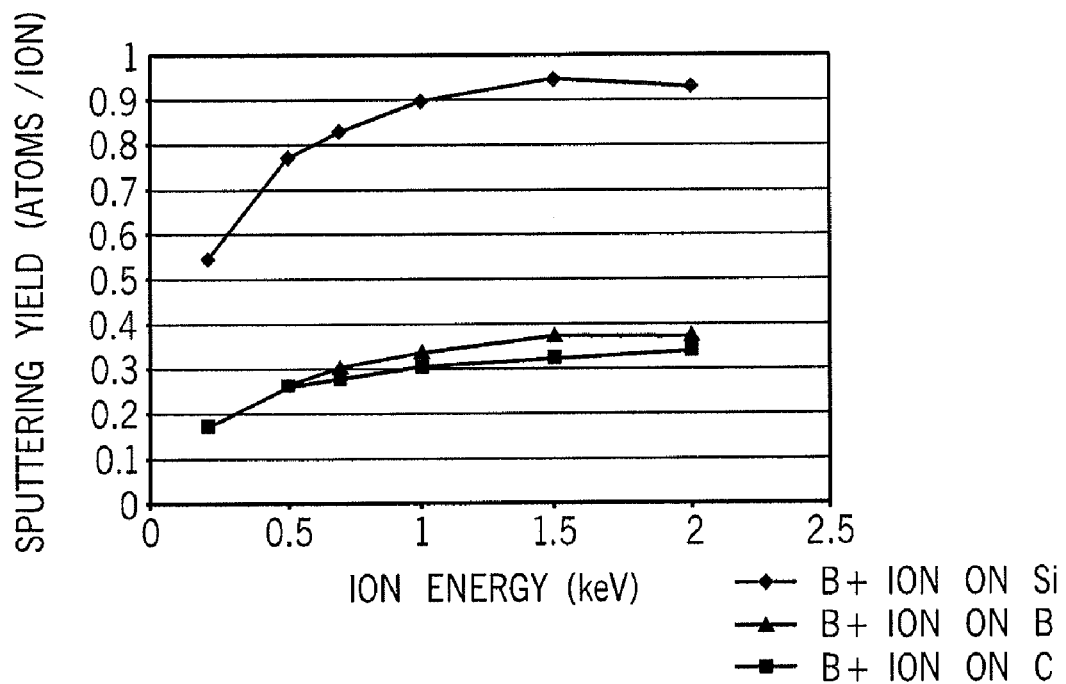
FIG. 13 graphically illustrates sputtering yields (atoms/ion) of boron ions on silicon, boron and carbon substrates at $B^+$ ion energies between 0 and 2.5 keV based on an ion implantation computer simulation using SRIM2006 software (♦=$B^+$ ion on silicon; ▲=$B^+$ ion on boron; ■=$B^+$ ion on carbon).
Figure 14:
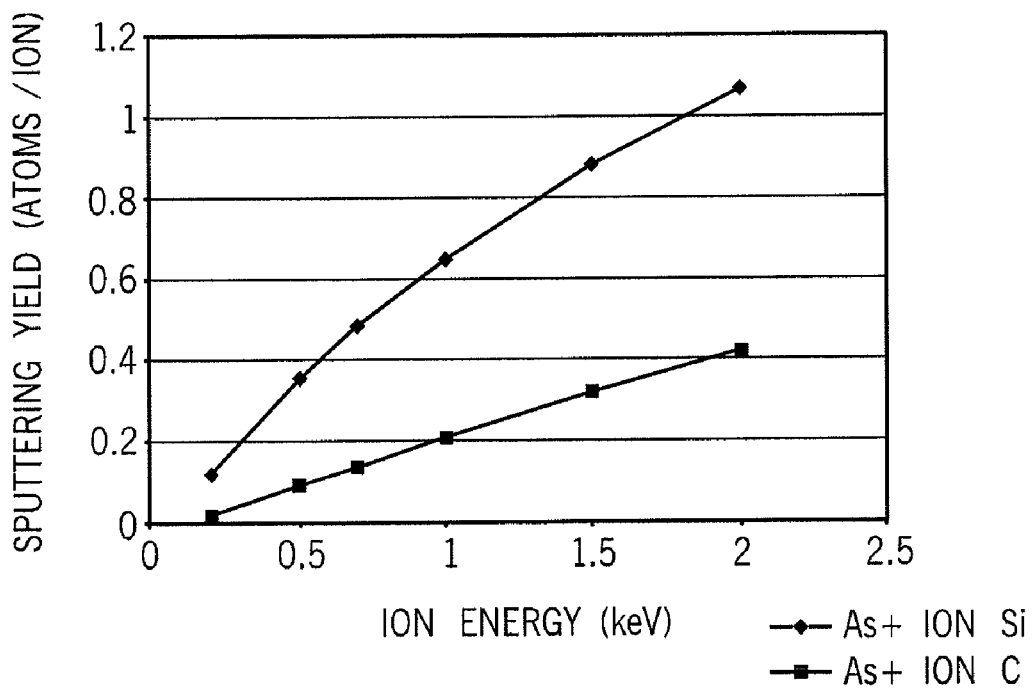
FIG. 14 graphically illustrates sputtering yields (atoms/ion) of arsenic ions ($As^+$) on silicon and carbon substrates at $As^+$ ion energies between 0 and 2.5 keV based on an ion implantation computer simulation using SRIM2006 software (♦=$As^+$ ion on silicon; ■=$As^+$ ion on carbon).

FIG. 13 illustrates the sputtering yields (atoms/ion) of boron ions on silicon, boron and carbon substrates versus the $B^+$ ion energy (keV). FIG. 14 illustrates the sputtering yields (atom/ion) of arsenic ($As^+$) ions on silicon and carbon substrates versus the $As^+$ ion energy (keV).

The sputtering yield data for Tables I and II and FIGS. 13 and 14 was based on an ion implantation computer simulation using SRIM2006 software (J. F. Ziegler, http://www.SRIM.org/). Of the listed materials, boron (B) and carbon (C) were chosen for further study due to their lower sputtering yield, being about one-third the sputtering yield of a silicon substrate in an energy range of 200 eV to 2 keV.

Table II (below) lists the sputtering yield or rate data (at Å/sec) of boron ($B^+$) and arsenic (As+) ions implanted on different substrates (silicon, boron, carbon) versus the implant energy at 200 eV, 500 eV and 1 keV. The data are based on Table I and assume that the doping rates of the impurities at all energies (i.e., nominal doping rate) are fixed at 4e13 $cm^2$/sec, and the sputtering rate of 500 eV $B^+$ ions implanted on silicon substrates is 3 Å/second.

TABLE II

Sputtering Rate Data (Assume the Nominal Doping Rate is 4e13/$cm^2$-sec)

| | 200 eV (Å/sec) | 500 eV (Å/sec) | 1 keV (Å/sec) |
|---|---|---|---|
| $B^+$ on Si | 2.13 | 3 | 3.5 |
| $B^+$ on B | 0.64 | 1 | 1.2 |
| $As^+$ on Si | 0.447 | 1.37 | 2.52 |
| $As^+$ on C | 0.048 | 0.35 | 1.09 |

An ion implantation simulator DIED (Dynamic Ion-implantation with Etching and Deposition) was used to determine the final retained boron (B) profile/dose when sputtering or deposition effects were included. A DIED simulator is a MATLAB®-based software that iteratively computes the retained implanted dopant profile, dose, and maximum concentration including the etching (sputtering or RIE) and deposition effects. The impurity profiles of DIED use Pearson-IV profile function (J. F. Ziegler, http://www.SRIM.org/), which is a more accurate function than simple symmetrical Gaussian function.

Figure 15:
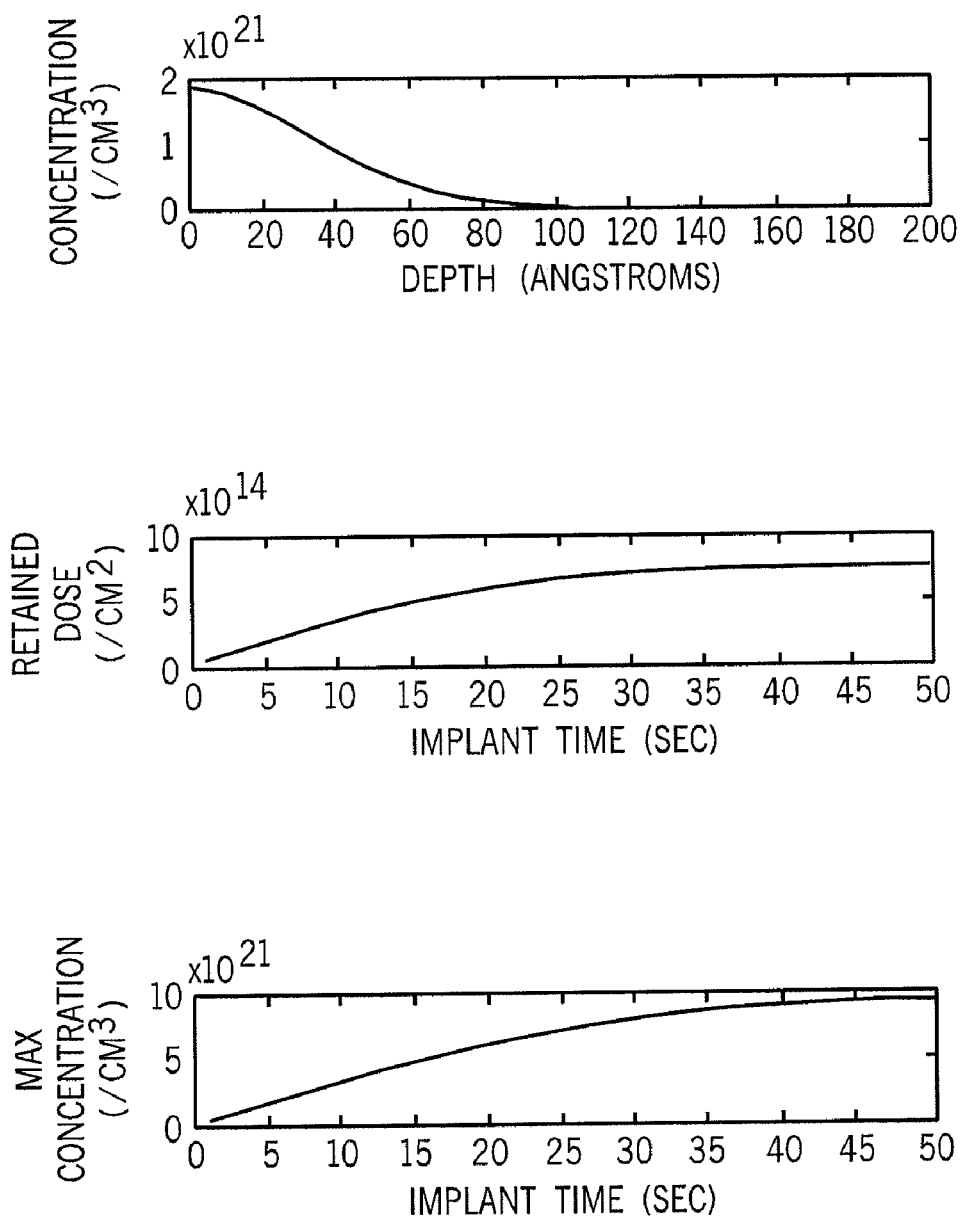
FIG. 15 graphically illustrates typical DIED simulation results assuming 500 eV $B^+$ ion implanted on a silicon substrate with a nominal dose of 2e15 ions/$cm^2$ and a sputtering rate of 3 angstroms (Å) per 4e13 ions/$cm^2$ nominal dose (implant time: 50 seconds, nominal dose/second: 4e13 ions/$cm^2$, sputtering/second: 3 Å) (Pearson-4 Profile: Rp=40 Å, Sp=22 Å, skewness=0.5418; kurtosis=2.9763).

FIG. 15 illustrates a typical DIED simulation result assuming 500 eV $B^+$ ion implanted on a silicon substrate with a nominal dose of 2e15 ions/$cm^2$ and a sputtering rate of 3 Å per 4e13 ions/$cm^2$ nominal dose. The doping rate was 4e13 ions/$cm^2$-sec, so that the total implant time was 50 seconds for 2e15/$cm^2$ nominal dose. Due to the sputtering effect, the retained B profile becomes half Gaussian-like function, the retained B dose is saturated at about 7e14 atoms/$cm^2$, and the maximum concentration is saturated at about 1.9e21 atoms/$cm^3$.

The results show that a boron (B) film can be pre-deposited as a sacrificial film to reduce the sputtering effect to about one-third of the sputtering yield of a silicon substrate, and improve the retained dose loss issues caused by sputtering effects during the ion implantation. Assuming that a boron (B) substrate has a sputtering rate of 1 Å per 4e13 ions/$cm^2$ nominal dose, for a nominal dose of 2e15 ions/$cm^2$, it will take about 50 seconds to complete the implant during which about 50 Å of the B substrate will be removed by sputtering effect. In an embodiment of the invention, an about 50 Å boron (B) film can be pre-deposited on a silicon wafer surface as a sacrificial layer so that when the ion implantation is completed, the sacrificial B film is concurrently and completely removed by the self-sputtering action by the end of the ion implantation process. The B dose loss from the silicon bulk by sputtering effect can thus be reduced.

Figure 16:
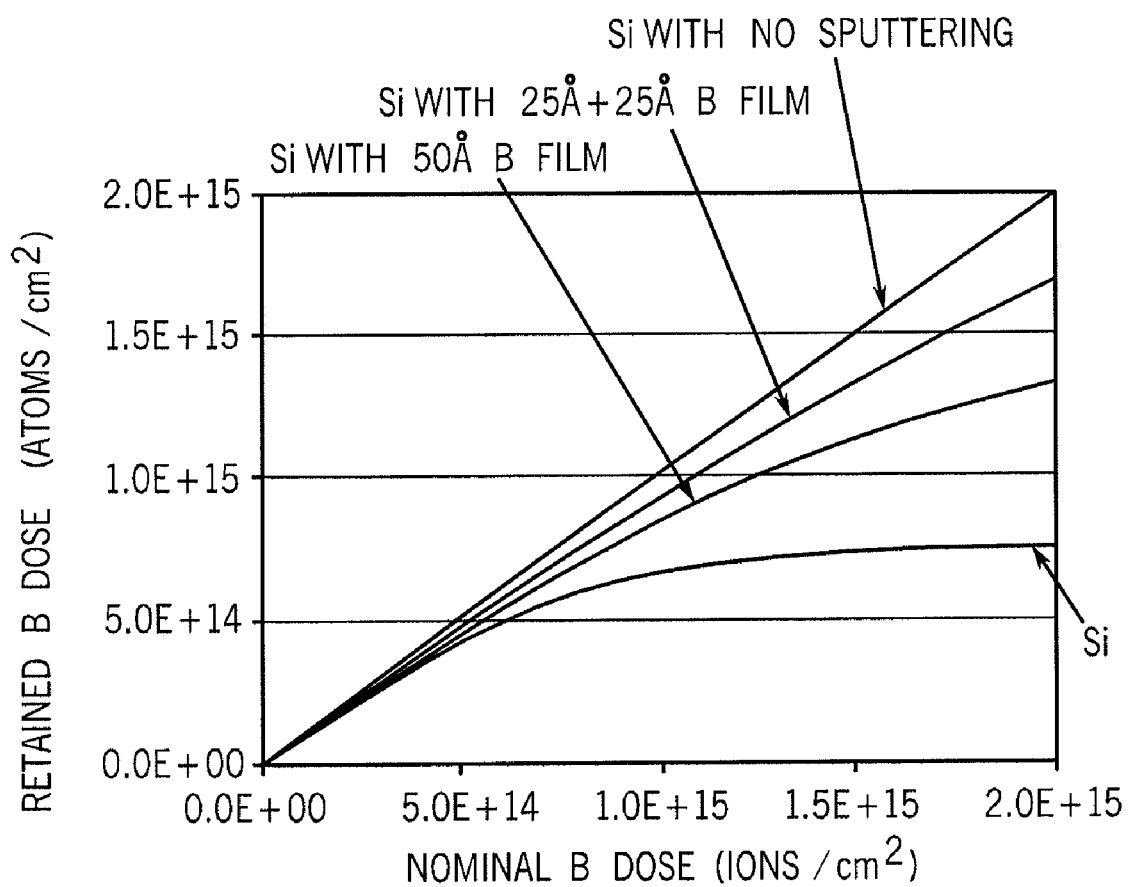
FIG. 16 graphically illustrates a comparison of the retained boron ($B^+$) ion doses (atoms/$cm^2$) versus nominal B doses (ions/$cm^2$) by DIED simulations for a silicon substrate with no sputtering, a silicon substrate with sputtering, and a silicon substrate with sputtering of an overlying 50 Å boron (B) film (500 eV $^{11}B^+$ beam-line ion implant on silicon).
Figure 17:
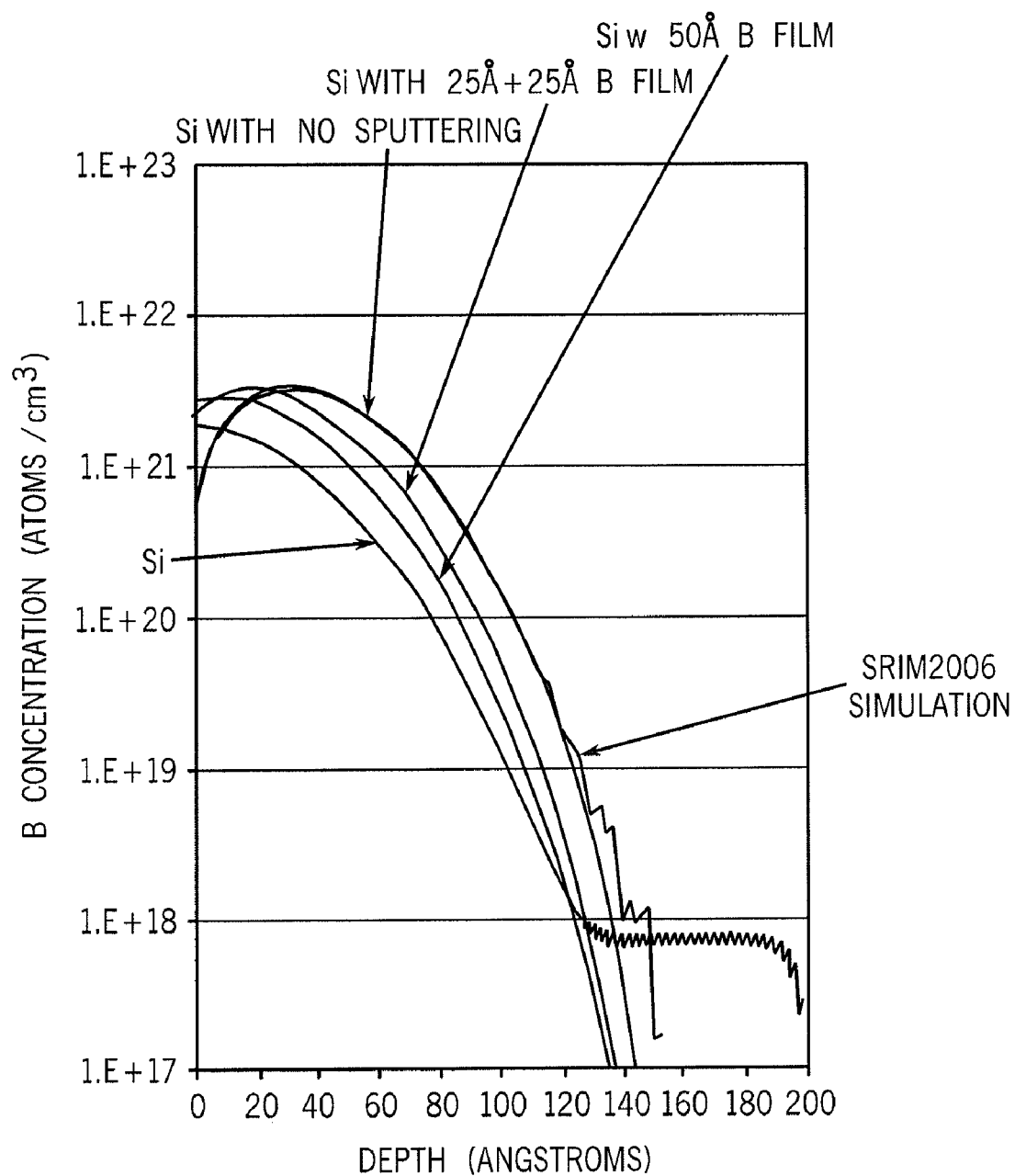
FIG. 17 graphically illustrates a comparison of the retained B profiles (B concentration in atoms/$cm^3$ versus depth in angstroms) by DIED simulations for a silicon substrate with no sputtering, silicon substrate with sputtering, and silicon substrate with sputtering of an overlying 50 Å boron (B) sacrificial film (500 eV $^{11}B^+$ beam-line ion implant on silicon).

FIG. 16 illustrates a comparison of the retained boron ($B^+$) ion dose (atoms/$cm^2$) versus nominal B dose (ions/$cm^2$), and FIG. 17 illustrates retained B profiles by DIED simulations for a silicon substrate with no sputtering, silicon substrate with sputtering, a silicon substrate with an overlying pre-deposited 50 Å boron (B) sacrificial film, and an embodiment (discussed below) in which a 2e15/$cm^2$ nominal dose implant is performed in two steps with each implant step involving a pre-deposit of a 25 Å boron (B) film and implanting half of the nominal dose (i.e., 1e15/$cm^2$). The results show that when there is no sputtering effect, the retained B dose equals the nominal B dose (FIG. 16), and the final B profile is a Pearson-IV function with a higher maximum concentration (FIG. 17). FIG. 17 also demonstrates a high level of agreement of boron (B) profiles between DIED simulation and SRIM2006 simulation.

A comparison of the results of sputtering a silicon (Si) substrate with sputtering a boron (B) sacrificial film situated on a silicon (Si) substrate according to embodiments of the invention shows a significant improvement on retained B dose and maximum concentration saturations. The results indicated that the retained B dose did not reach saturation and is about double to that of silicon (Si) substrate at a nominal dose of 2e15 ions/$cm^2$ with a 77% retained dose increase (FIG. 16).

In another embodiment, the implant process can be divided into multiple steps, with a sacrificial material layer deposited prior to each implant step. For example, a 2e15 ions/cm² dose implant can be divided into two steps by pre-depositing a 25 Å boron (B) sacrificial film and ion implanting one-half of the required nominal dose (i.e., 1e15 ions/cm²), with the sacrificial film being completely removed by self-sputtering at the end of the first implant step. A second 25 Å boron (B) sacrificial film can then be pre-deposited and the remaining half of the required nominal dose (i.e., 1e15 ions/cm²) ion implanted, wherein the second sacrificial film is also completely removed by self-sputtering from the doped silicon substrate at the end of the second implant step.

As illustrated in FIGS. 16 and 17, the use of a multiple step (e.g., two-step) implant process using multiple pre-formed 25 Å boron (B) sacrificial layers provided a higher retained boron (B) dose and maximum ion concentration compared to a one-step boron (B) implant process using a single pre-formed 50 Å boron (B) sacrificial film. The results also show that the retained B⁺ dose increased by 127% compared to the B⁺ dose resulting from a conventional implant process of a silicon (Si) substrate without the use of a sacrificial layer.

Table III (below) lists the simulation results of retained boron (B⁺) dose, retained boron (B⁺) dose fraction (retained B dose/implant nominal B dose), and process improvements (B⁺ dose increase) of B⁺ ion implants at different energies when the exposed substrate is silicon (Si) (conventional implant process), and by a sputtering-less implant processing according to embodiments of the invention using a boron (B) sacrificial film substrate over silicon by a one-step and by a two-step deposition/implant process (based on an implant nominal B dose of 2e15 ions/cm²). With sputtering-less implant processing according to the invention, the retained boron doses can be increased from about 77% up to about 244% depending upon the implant energies and processing embodiment (i.e., 1-step or multi-step) that are used.

TABLE III

Retained B Dose and Retained B Dose Fraction (Retained Dose/Nominal Dose) and Improvement by Sputtering-less Implant; Implant Nominal B Dose is 2e15/cm²

| | | Ion Energy | | |
|---|---|---|---|---|
| | | 200 eV (/cm²) | 500 eV (/cm²) | 1 KeV (/cm²) |
| B⁺ implant on Silicon | Retained Dose | 7.459E+14 | 7.459E+14 | 4.915E+14 |
| | Fraction | 37.30% | 37.30% | 24.58% |
| | Improvement | NA | NA | NA |
| One time B⁺ implant on Silicon with sacrificial B film | Retained Dose | 1.892E+15 | 1.323E+15 | 1.323E+15 |
| | Fraction | 94.60% | 66.17% | 66.17% |
| | Improvement | 153.62% | 77.40% | 169.20% |
| Two time B⁺ implant on Silicon with sacrificial B film | Retained Dose | 1.892E+15 | 1.692E+15 | 1.692E+15 |
| | Fraction | 94.60% | 84.59% | 84.59% |
| | Improvement | 153.62% | 126.77% | 244.14% |

Methods of the invention utilize a sacrificial material layer that provides a lower sputtering rate than the substrate to be implanted, resulting in an improvement (i.e., reduction) of the sputtering effect of low energy ion implants on the dopant-implanted substrate. Sacrificial material layers utilized according to the methods of the invention are removed by self-sputtering during the ion implantation process, which eliminates the need to remove the sacrificial material after the ion implant is completed, thereby reducing the number of required processing steps. By comparison, other materials, such as oxides (e.g., $SiO_2$), that have a similar sputtering rate as silicon (Si) do not improve or reduce the sputtering effect of low energy ion implants, and must also be removed after the process has been completed.

Some embodiments of the invention, for example, utilize a boron or carbon sacrificial layer for a boron (B⁺) ion implantation, and a carbon sacrificial layer for an arsenic (As⁺) ion implantation. Advantages of using carbon (C) as the sacrificial material layer (or a boron (B) layer in the case of a boron implant) compared to other materials include a lower sputtering yield than silicon, no contamination of the silicon substrate, less particle generation, compatibility to the ion implant, and ease of processing the material to form the sacrificial layer (e.g., by ALD, PLAD, etc.).

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of implanting dopant ions in a silicon substrate comprising an overlying sacrificial material, the method comprising:
    implanting the dopant ions into the silicon substrate while sputtering the sacrificial material without substantially sputtering the silicon surface, wherein substantially no sacrificial material remains on the silicon substrate upon completion of the implanting of the dopant ions.

2. The method of claim 1, wherein implanting the dopant ions comprises implanting a p-type dopant.

3. The method of claim 1, wherein implanting the dopant ions into the silicon substrate while sputtering the sacrificial material comprises implanting boron ions into the silicon substrate while sputtering a boron material.

4. The method of claim 3, wherein sputtering a boron material comprises sputtering the boron material selected from the group consisting of boron and boron carbide.

5. The method of claim 1, wherein implanting the dopant ions into the silicon substrate while sputtering the sacrificial material comprises implanting boron ions into the silicon substrate while sputtering a carbon material.

6. The method of claim 5, wherein sputtering a carbon material comprises sputtering the carbon material selected from the group consisting of carbon, amorphous carbon, and silicon carbide.

7. The method of claim 1, wherein implanting the dopant ions comprises implanting an n-type dopant.

8. The method of claim 1, wherein implanting the dopant ions into the silicon substrate while sputtering the sacrificial material comprises implanting phosphorus ions or arsenic ions into the silicon substrate while sputtering a carbon material.

9. The method of claim 8, wherein implanting the dopant ions into the silicon substrate while sputtering the sacrificial material comprises implanting the phosphorus ions or arsenic ions into the silicon substrate while sputtering a carbon material selected from the group consisting of carbon, amorphous carbon and silicon carbide.

10. The method of claim 1, wherein implanting the dopant ions into the silicon substrate while sputtering the sacrificial material comprises implanting phosphorus ions into the silicon substrate while sputtering a phosphorus material.

11. The method of claim 1, wherein implanting the dopant ions into the silicon substrate while sputtering the sacrificial material comprises implanting arsenic ions into the silicon substrate while sputtering an arsenic material.

12. The method of claim 1, further comprising forming the sacrificial material by a vapor deposition process prior to implanting the dopant ions.

13. The method of claim 12, wherein forming the sacrificial material comprises physical vapor deposition by sputtering.

14. The method of claim 1, further comprising forming the sacrificial material by a process selected from the group consisting of atomic layer deposition, chemical vapor deposition and plasma enhanced chemical vapor deposition prior to implanting the dopant ions.

15. The method of claim 1, further comprising forming the sacrificial material by thermal (plasma) spraying prior to implanting the dopant ions.

16. The method of claim 1, further comprising, after implanting the dopant ions, forming a second sacrificial material on the silicon substrate, and implanting additional dopant ions.

17. The method of claim 1, wherein the implanting comprises an ultralow energy ion implantation process.

18. The method of claim 1, further comprising, prior to implanting the dopant ions,
forming a patterned mask layer on the silicon substrate to expose a portion of the silicon substrate; and
forming the sacrificial material on the exposed silicon substrate.

19. The method of claim 18, further comprising, after implanting the dopant ions, removing the patterned mask layer.

20. A method of implanting dopant ions in a silicon substrate comprising an overlying sacrificial material, the method comprising:
implanting the dopant ions into the silicon substrate while sputtering the sacrificial material such that there is substantially no sputtering of the silicon surface during the implanting and substantially no sacrificial material remains on the silicon substrate at the completion of the implanting of the dopant ions.

21. A method of implanting dopant ions in a silicon substrate comprising an overlying sacrificial material, the method comprising:
implanting a first dose of the dopant ions into the silicon substrate while sputtering the sacrificial material without substantially sputtering the silicon surface, wherein substantially no sacrificial material remains on the silicon substrate upon completion of the implanting of the first dose of the dopant ions;
after the implanting the first dose, forming a second sacrificial material over the silicon substrate comprising the first dose of dopant ions; and
implanting a second dose of the dopant ions into the silicon substrate while sputtering the second sacrificial material without substantially sputtering the silicon surface, wherein substantially no second sacrificial material remains on the silicon substrate upon completion of the implanting of the second dose of the dopant ions.

22. The method of claim 21, further comprising:
after the implanting the second dose, forming a third sacrificial material over the silicon substrate comprising the second dose of dopant ions; and
implanting a third dose of the dopant ions into the silicon substrate while sputtering the third sacrificial material without substantially sputtering the silicon surface, wherein substantially no third sacrificial material remains on the silicon substrate upon completion of the implanting of the third dose of the dopant ions.

23. The method of claim 21, wherein forming a second sacrificial material over the silicon substrate comprises forming the second sacrificial material comprising the same composition as the sacrificial material over the silicon substrate.

* * * * *